US006834113B1

(12) United States Patent
Liljehag et al.

(10) Patent No.: US 6,834,113 B1
(45) Date of Patent: Dec. 21, 2004

(54) LOUDSPEAKER SYSTEM

(76) Inventors: Erik Liljehag, Gåvstavägen 98, Uppsala (SE), 755 96; Martin Löfgren, Sunnanäng Hagby, Vängo (SE), 740 20; Gunnar Löfgron, Ferlinsgatan 49, Uppsala (SE), 754 28

( * ) Notice: Subject to any disclaimer, the term of this patent is extended or adjusted under 35 U.S.C. 154(b) by 0 days.

(21) Appl. No.: 09/518,510

(22) Filed: Mar. 3, 2000

(51) Int. Cl.[7] .......................... H03G 5/00; H04R 1/00; H04R 25/00; H05K 5/00; H03H 7/48

(52) U.S. Cl. .......................... 381/99; 381/98; 381/402; 381/184; 381/186; 381/399; 181/144; 333/132

(58) Field of Search .......................... 381/424, 402, 381/99, 401, 182, 98, 399, 184, 186; 181/145, 144; 333/132, 133

(56) References Cited

U.S. PATENT DOCUMENTS

| | | | | | |
|---|---|---|---|---|---|
| 3,138,667 | A | | 6/1964 | Avedon | 179/1 |
| 4,384,173 | A | * | 5/1983 | Briefer et al. | 381/431 |
| 4,940,108 | A | * | 7/1990 | Selby | 181/145 |
| 5,802,190 | A | * | 9/1998 | Ferren | 381/182 |
| 6,343,133 | B1 | * | 1/2002 | Adamson | 381/340 |
| 6,628,793 | B1 | * | 9/2003 | Porzilli et al. | 381/182 |

FOREIGN PATENT DOCUMENTS

| | | | |
|---|---|---|---|
| WO | WO 9807297 A1 * | 2/1998 | H04R/25/00 |
| WO | WO 99/55117 | 10/1999 | |
| WO | WO 99/55118 | 10/1999 | |

OTHER PUBLICATIONS

Tremaine, H.M. "The Audio Cyclopedia", 2nd Ed. Mar. 29, 1977, pp. 1153–1156 (Indianapolis 1969).*

Jordan, E.J., "Multiple–Array Loudspeaker System," *Wireless World*, Mar. 1971, pp. 132–134.

Heil, C., "Developing the V–DOSC TM Speaker System", Heil Acoustics, France; Cox Audio Engineering, Sun Valley, California; www.coxaudio.com/innovations.html (Feb. 2000), 17 pages.

* cited by examiner

*Primary Examiner*—Minsun Oh Harvey
*Assistant Examiner*—Andrew Graham
(74) *Attorney, Agent, or Firm*—Jenkens & Gilchrist, P.C.

(57) ABSTRACT

A loudspeaker system, which has the ability to create a homogeneous sound over large distances, comprising at least one line-source of acoustical radiation, each comprising three or more essentially identical speaker-units arranged adjacent to each other at a center-to-center spacing $D_1$, and at least one elongated high frequency transducer arranged in parallel with said line source(s), said elongated high frequency transducer(s) having an essentially continuous radiating surface along the axis of elongation. Where the crossover frequency $F_{CR}$ and the distance $D_1$, for said line-source(s), is set according to new design criteria, taking into account the frequency response from said speaker units in said line-sources and the optimal performance for a line-source. A method is also included, by which a homogeneous sound over large distances can be accomplished.

25 Claims, 10 Drawing Sheets

LOUDSPEAKER SYSTEM

TECHNICAL FIELD OF THE INVENTION

The present invention relates generally to a loudspeaker system, and in particular to a system with the ability to create a homogeneous sound over large distances.

RELATED ART

In the field of sound reproduction the audio signal has to pass through a number of different devices, such as microphone, mixer table, amplifier, crossover filter and loudspeakers, before it reaches the listener. In some of these devices the processing only deals with an electrical signal, such as in the mixer table and in the amplifier, and this processing does not significantly affect the quality of the signal. However, the two devices that carry out the conversion from sound waves to an electrical signal and back again, i.e. the microphone and the loudspeaker, must include mechanical parts, and therefore these devices represent the weakest elements in the sound reproducing chain. To improve the sound quality of a sound reproduction system, it is usually best to put effort in improving these two devices, especially the loudspeaker.

It is known that the loudspeaker is the weakest element in the sound reproducing chain. This is especially true in the field of public address (PA) systems, namely systems for addressing many people over large distances, i.e. at big events such as rock concerts, sports events and the like. It can also involve the transmission of verbal information to customers in a mall, or passengers at an airport or a railway station.

One important aspect when constructing a PA-system, is to make sure that all frequencies (20 Hz–20 kHz) reach the ear of a listener simultaneously and at the same level, wherever in the audience he or she is located. This aspect is generally overseen in systems of this kind, as loudspeakers that reproduce different parts of the frequency range often are placed at a large distance from each other. An example of this, is that the low frequency loudspeakers normally are placed on the stage, while mid and high frequency loudspeakers are arranged hanging above the stage. Arrangements of this kind further represent a large array of point sources, with large interference problems as a result. This is especially true for the common fan-shaped arrangement, used to increase the horizontal coverage, but such an arrangement suffers from severe deviations in time, phase and frequency response.

Due to the large distances and large areas at concerts, the car will experience the time and phase deviations as annoying. Thus, incorrect placement of the loudspeakers causes large deviations in frequency and phase, which in conjunction with the loudspeaker distortion result in that the sound gets tiring for the human ear.

Common technology is furthermore limited when it comes to producing high sound-pressure over long distances. It is known that the sound-pressure from a conventional PA-system drops dramatically after about 50 meters, because of interference. The normal approach used to compensate for this is to increase the efficiency of the loudspeaker, for example by using horns, but that only generate a higher sound-pressure close to the speaker, and not necessary at large distances.

A known technique to achieve directed sound energy, is to use a line-source, which is described more in detail in "Multiple-array loudspeaker system.", E. J. Jordan, Wireless World, March 1971, pp 132–134 and "Audio cyclopedia", H. M. Tremaine, Mar. 29, 1977, pp 1153–1156. If a number of speaker units (three or more) are mounted to form a linear array with minimum spacing between the speaker units, the sound energy emanating from the speaker units tend to be directed perpendicularly to the long axis of the array. Thus, in a speaker-system, if the speaker units are arranged in a vertical array, vertical dispersion of the sound is minimized and the sound can be concentrated in the direction of the listeners. The vertical direction characteristics of a (vertically orientated) line-source 1 are shown in FIG. 1, wherein the solid line represents an idealized distribution (2*a*). In practice, due to the fact that the radiating area is not a continuous line but is made up of discrete units, at frequencies where the wavelength is comparable to the physical spacing between the speaker units, the vertical distribution splits up into lobes. The main forward facing lobe 2*b* becomes excessively sharp and upward and downward lobes (3*a*, 3*b*) appear (broken lines in FIG. 1). The common method of overcoming this is to grade the electrical power fed to the speaker units, so that the centre speaker receives the maximum power, the adjacent speaker units above and below receive say √2 of this power and so on. Another way to minimise the unwanted lobes at high frequencies, is by frequency grading. Thereby, the centre speaker receives the full frequency range and the high frequencies are progressively reduced for units away from the centre. A system of this land is disclosed in U.S. Pat. No. 3,138,667.

This method then only uses the advantages of the line-source configuration at lower frequencies, whereas it represents a conventional single point source at high frequencies, with the result that the directional effect is gradually lost in the higher frequency range.

If the distances between the speaker units in a line-source gradually are made smaller, the line-source eventually becomes a continuous line-source, which can be seen upon as an idealised line-source. There are several known types of speaker types that could be used to construct an idealised line-source, such as ribbon, electrostatic, magnetostatic. However, these speaker types are typically limited in the low frequency response.

One way to overcome the limitations with the line-source arrangements described above, is to combine a low frequency line-source and idealised line-source capable of reproducing high frequencies. One system of this kind is V-DOSC™ by Heil Acoustics, France. Information concerning this system can be found at the homepage of Coxaudio and in the preprint #3269 "Sound fields radiated by multiple sound source arrays" presented at the 92$^{nd}$ Audio Engineering Society (AES) convention in Vienna.

The underlying theory which is presented in preprint #3269, defines the acoustic coupling conditions for successfully arraying individual sound sources, including wavelength, the shape of each source, their surface areas and their relative distance. Briefly, the coupling conditions according to this theory can be summarized as follows:

An assembly of individual sound sources arrayed following a regular step distance on a planar or curved continuous surface is equivalent to a single sound source leaving the same dimensions as the total assembly if one of the following two conditions is fulfilled:

1. Frequency: The step distance (the distance between the acoustic centers of individual sources) is smaller than the wavelength.

2. Shape: The wavefronts generated by individual sources are planar and together fill at least 80 percent of the total radiating surface area.

The V-DOSC™ system is a modular line-source system where two or more sub-units have to be arranged on top of each other to create a line-source. However, this system has a limited horizontal coverage of 90°, and due to the construction with two line-sources mounted in a V arrangement with a high frequency horn in between, the system suffers from phase and time deviations. Due to that the line-source and the horn produce sound with different compression levels, the system is not capable of producing a linear frequency response at large distances.

Another big problem that conventional systems, as well as the V-DOSC™ system, suffers from if they are not placed correctly, is that the highly directed sound produces a great deal of early refections, or if unavoidable obstacles are present.

SUMMARY OF THE INVENTION

According to the present invention there is provided a loudspeaker system for creating a homogenous sound over large distances with a wide horizontal distribution comprising at least one line-source of acoustical radiation, each comprising three or more essentially identical speaker-units arranged adjacent to each other at a spacing $D_1$, and at least one elongated high frequency transducer arranged in parallel with said line source(s), said elongated high frequency transducer(s) having an essentially continuous radiating surface along the axis of elongation.

Thereby, the loudspeaker system is able to produce a constant sound-pressure along the whole of its length over large distances.

Preferably, the loudspeaker system further comprises, an input electrical audio signal divided into two parts at a crossover frequency $F_{CR}$, with an attenuation of at least 18 dB/octave, wherein said first part comprise frequencies lower than a crossover frequency $F_{CR}$, and which said second part comprise frequencies higher than said crossover frequency $F_{CR}$, whereby the first part is fed to said line-source(s) of acoustical radiation and the second part is fed to said elongated high frequency transducer(s), wherein the highest possible crossover frequency $F_{MAX}$ ($F_{CR} \leqq F_{MAX}$), for the individual speaker units in said line-source(s) of acoustical radiation, is determined as a frequency, which is at least a one octave lower than a frequency $F_{DEV}$, said frequency $F_{DEV}$ is a frequency at which neither of the speaker response on-axis nor the speaker unit response 60° off-axis deviate more than ±3 dB from the speaker response 30° off-axis, and/or at which the speaker responses on-axis do not deviate more than ±3 dB from the nominal sensitivity level $L_{nom}$ (300–1000 Hz), said spacing $D_1$ between the essentially identical speaker-units in the line-source(s) of acoustical radiation, is less than one half of the wavelength corresponding to a frequency $F_{C-C}$, said frequency $F_{C-C}$, is, at a crossover attenuation of at least 24 dB/octave, one quarter of an octave lower than $F_{MAX}$, and, at a crossover attenuation that is less than 24 dB/octave, $F_{C-C}$ is equal to $F_{MAX}$.

A loudspeaker system of this type has the ability to create a homogeneous sound, without frequency and/or phase deviations at large distances. More specifically it is able to produce a low distorted sound with high resolution, with a wide homogeneous distribution (up to 170°) in the horizontal plane, and an extremely narrow distribution in the vertical plane (0–5°). Further, due to the wide homogeneous distribution (up to 170°) in the horizontal plane, problems related to early reflections, are minimized.

More preferably said elongated high frequency transducer(s) are of ribbon type, comprising two or more elongated magnet elements arranged in parallel to each other and distant from each other, such that two adjacent magnet elements form an elongated slit in which an elongated membrane of an electrically conducting material is moveably provided, said membrane being electrically coupled such that it can conduct a drive current in the longitudinal direction of the membrane, wherein a conducting/supporting piece, made of ferro-magnetic material, is provided between the outermost located magnet elements, said conducting/supporting piece closing the magnetic circuit but leaving the slit or slits open in which the membranes are provided. In this way an outstanding performance is achieved at higher frequencies.

In a further embodiment, the present invention further provides a loudspeaker system, comprising two or more sub-sections each supporting one or more speaker units, said sub-sections all arranged to be attached close to each other, in such a manner that they together form one or more line-sources of acoustical radiation and one or more elongated high frequency transducers. Thus a system is achieved that easily can be adapted to various conditions and needs, which system still is easy to handle.

According to the present invention there is also provided a method for creating a homogenous sound over large distances, comprising the following steps:

providing at least one line-source of acoustical radiation, each comprising three or more essentially identical speaker-units arranged adjacent to each other at a spacing $D_1$, and at least one elongated high frequency transducer arranged in parallel with said line source(s), said elongated high frequency transducer(s) having an essentially continuous radiating surface along the axis of elongation;

providing an input electrical audio signal divided into two parts at a crossover frequency $F_{CR}$, with an attenuation of at least 18 dB/octave, wherein said first part comprise frequencies lower than a crossover frequency $F_{CR}$, and which said second part comprise frequencies higher than said crossover frequency $F_{CR}$, whereby the first part is fed to said line-source(s) of acoustical radiation and the second part is fed to said elongated high frequency transducer(s), defining the highest possible crossover frequency $F_{MAX}$ ($F_{CR} \leqq F_{MAX}$), for the speaker units in said line-source(s) of acoustical radiation, as a frequency, which is at least a one octave lower than a frequency $F_{DEV}$, defining said frequency $F_{DEV}$ as a frequency at which neither of the speaker response on-axis nor the speaker response 60° off-axis deviate more than ±3 dB from the speaker response 30° off-axis, and/or at which the speaker response on-axis do not deviate more than ±3 dB from the nominal sensitivity level $L_{nom}$ (300–1000 Hz), defining said spacing $D_1$ between the essentially identical speaker-units in the line-source(s) of acoustical radiation, to be less than one half of the wavelength corresponding to a frequency $F_{C-C}$, defining said frequency $F_{C-C}$, to be one quarter of an octave lower than $F_{MAX}$, at a crossover attenuation of at least 24 dB/octave, and to be equal to $F_{MAX}$, at a crossover attenuation that is less than 24 dB/octave.

DETAILED DESCRIPTION OF PREFERRED EMBODIMENTS

For the purpose of this invention, the expression "transducer" shall mean, an electro-acoustical transducer unit comprising one or more separate speaker units.

Figure 1:
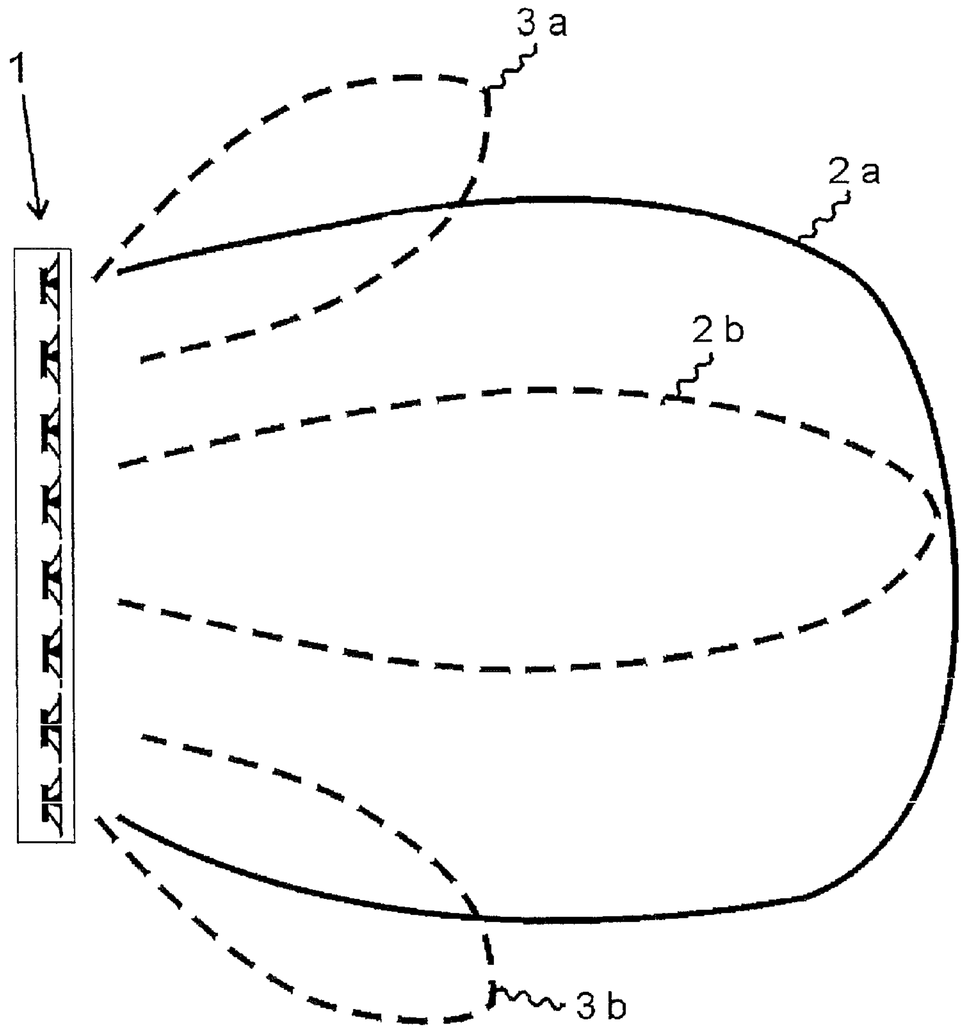
FIG. 1 shows a vertical distribution pattern from a line-source.
Figure 2:
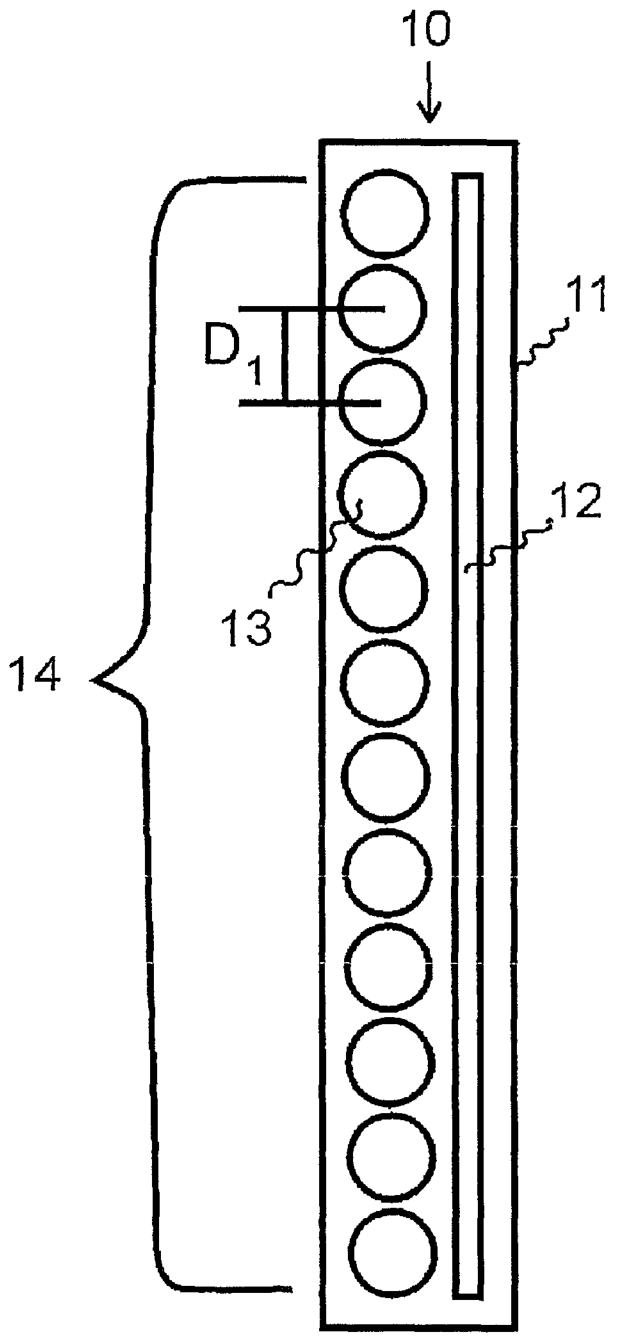
FIG. 2 shows a loudspeaker according to the invention.

In FIG. 2, a loudspeaker 10 according to the present invention is shown. In this embodiment, the loudspeaker comprises an enclosure 11, one elongated high frequency transducer 12 having an essentially continuous radiating surface along the axis of elongation, and twelve essentially identical low frequency speaker units 13. The enclosure 11 comprises a front baffle, which provides a rigid mounting surface for the speaker units and the high frequency transducer, two sidewalls, a top, a bottom, and a back wall. The low frequency speaker units 13 are preferably electro-dynamic cone speaker units, which are mounted to form a line-source 14 with minimum spacing between the speaker units. In the preferred embodiment, the line-source 14 is arranged in a vertical manner, and the high frequency transducer 12 is mounted in parallel with, and essentially as close as possible to the line-source 14. The radiating surfaces of the high-frequency transducer 12 and the line-source 14 are essentially of the same height. The high-frequency transducer 12 is preferably of ribbon type and will be described more in detail below. The low frequency speaker units 13 are preferably electrically connected in parallel, to ensure a synchronous pulse response, and the individual speaker impedance is adapted in such a way that the total impedance will not get too low.

The electrical audio signal used to drive the loudspeaker system 10 is supplied by an amplifying device, wherein the signal is split into two parts, which said first part comprise all frequencies lower than a crossover frequency $F_{CR}$, and which said second part comprise all frequencies higher than the crossover frequency $F_{CR}$, whereby the first part is fed the speaker units 13 in the line-source 14 and the second part is fed to the high frequency transducer 12. In the preferred embodiment, this splitting is performed prior to the power amplification, i.e. the amplifying device comprises an active crossover circuit, such as an EC500 from Dynamic Precision, Norway, and two amplifier circuits per channel. However, in suitable situations this splitting may be performed after the power amplification, i.e. the amplifying device comprises a crossover circuit of passive type, and one amplifier circuit per channel. In the preferred embodiment, the crossover attenuation is 24 dB/octave, but other attenuation values are applicable.

To achieve optimal horizontal distribution and phase performance, the crossover frequency $F_{CR}$ is determined to be lower than the frequency $F_{MAX}$, where $F_{MAX}$ is a frequency, which, for a crossover filter with attenuation of at least 18 dB/octave, is at least one octave lower than the frequency, at which the speaker unit 13 response on-axis and (or) 60° off-axis do not deviate more than ±3 dB from the response 30° off-axis, and/or at which the speaker unit 13 response on-axis do not deviate more than ±3 dB from the nominal sensitivity level, $L_{nom}$. Where $L_{nom}$ is the average sensitivity level between 300 Hz and 1000 Hz. If a crossover filter with attenuation less than 18 dB/octave is used, the frequency $F_{MAX}$ has to be lowered in a corresponding manner.

To avoid unwanted vertical distribution lobes, and to achieve maximum coupling between the speaker units 13 in the line-source 14, the center-to-center distance $D_1$ between two adjacent speaker units 13 in the line-source 14 has to be less than one half of the wavelength corresponding to a frequency $F_{C\text{-}C}$, which, for a crossover filter with attenuation of at least 24 dB/octave, is one quarter of an octave lower than $F_{MAX}$, and for crossover filters with attenuation less than 24 dB/octave, is equal to $F_{MAX}$.

To achieve optimal coupling between the line-source 14 and the elongated high frequency transducer 12, the center-to-center distance between them also has to follow the above rule, and the same applies to systems comprising several line-sources 14 and/or elongated high frequency transducers 12.

Figure 3:
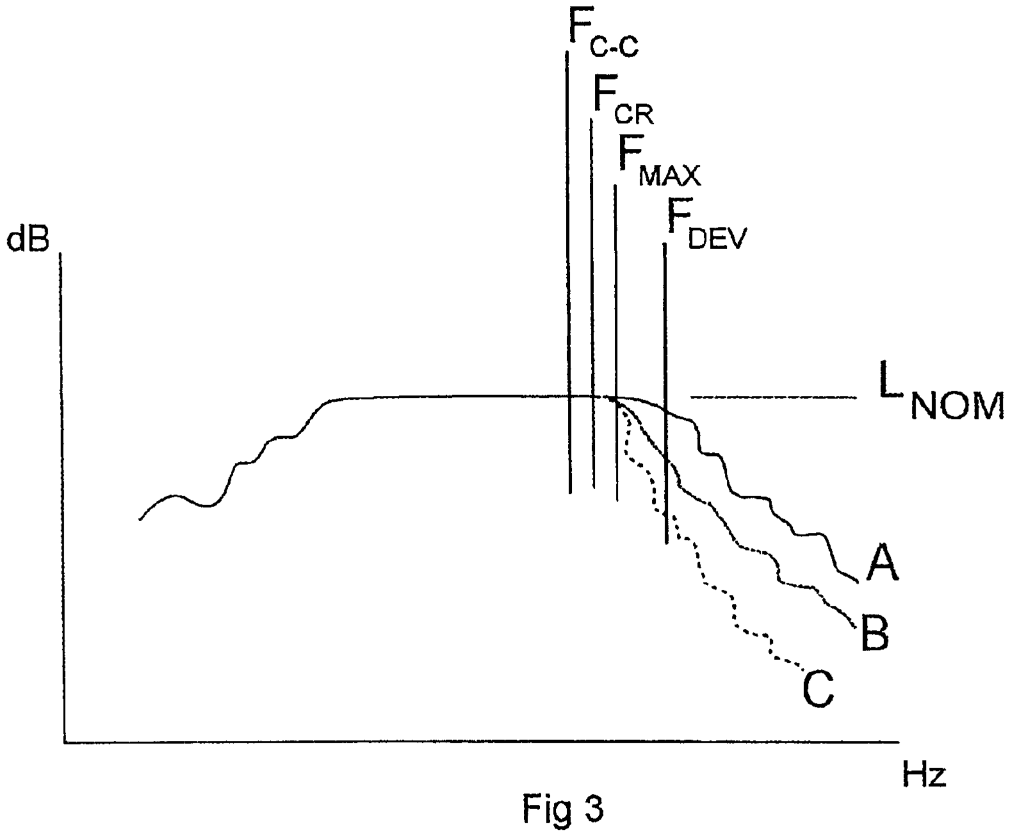
FIG. 3 shows a schematic frequency response diagram for a conventional speaker unit.

The determination of the frequency $F_{MAX}$ is better explained in combination with FIG. 3, which shows a schematic frequency response diagram for a conventional speaker unit 13. In the figure three lines are shown, where the solid line A represent the response measured on-axis (i.e. straight in front of the speaker unit 13), the dotted line B represent the response measured 30° off-axis, and the dashed line C represent the response measured 60° off-axis. The nominal sensitivity level (300–1000 Hz) is indicated by $L_{nom}$. The frequency indicated by $F_{DEV}$, is the highest frequency where the speaker unit 13 response on-axis A and/or 60° off-axis C do not deviate more than ±3 dB from the response 30° off-axis B, and where the speaker unit 13 response on-axis A do not deviate more than ±3 dB from the nominal sensitivity level (300–1000 Hz) $L_{nom}$.

When the center-to-center distance $D_1$ between two adjacent speaker units 13, in a line-source 14, is close to one half of the wavelength corresponding to $F_{C\text{-}C}$, a coupling effect occurs between adjacent speaker units 13, which significantly increases the performance of the line-source 14. The coupling gets stronger as the distance between the radiating surface of two adjacent speaker units 13 decreases, and eventually the line-source 14 becomes a continuous line-source, like the ribbon speaker.

Figure 10:
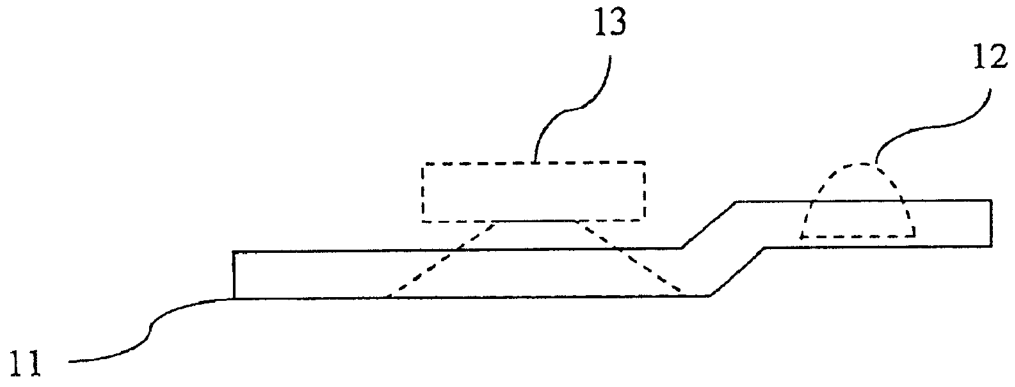
FIG. 10 shows another baffle for a loudspeaker according to the present invention.

In the preferred embodiment, the enclosure is of closed type, but other types of enclosures are also possible to use, such as vented, passive radiator or transmission line. The system could also be designed as a dipole. The front baffle of the enclosure or of the dipole provides a rigid mounting surface for the line-source, and the high frequency source, and it may be substantially flat. Alternatively, the baffle may provide different mounting levels for sources of different frequency ranges, in order to achieve phase-compensation, as the acoustic centers of the different source can be arranged in the same plane, as illustrated in FIG. 10.

Figure 4:
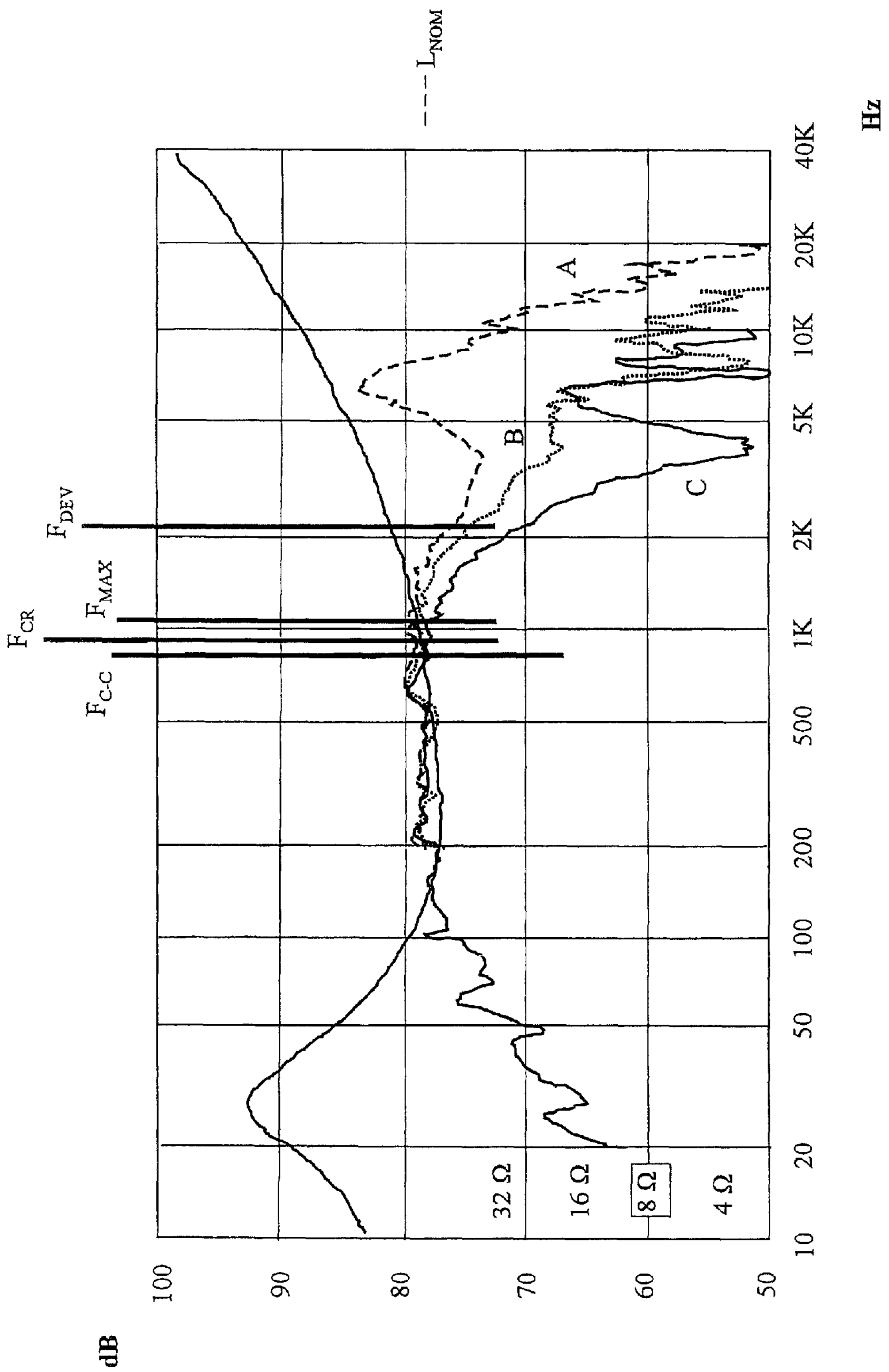
FIG. 4 shows a frequency response diagram for a speaker unit used in an exemplary embodiment of the invention.

In one exemplary embodiment of the loudspeaker 10 shown in FIG. 2, the low frequency line-source 14 comprises twelve essentially identical cone speaker units 13, and the high frequency transducer comprises one approx. 220-cm tall ribbon speaker unit 12. The crossover filter attenuation in the amplifying device is set to 24 db/octave. The line-source speaker units 13 are mounted at a center-to-center distance of 19 cm and the specific speaker unit characteristics are: diameter 18 cm, resonance frequency (Fs) 25 Hz, impedance (Z) 49 Ω, the frequency range and the response off-axis are shown in FIG. 4. The line-source speaker units 13 are electrically connected in parallel, and the resulting impedance is Z=49/12=4.08 Ω. In FIG. 4, it is shown that $F_{DEV}$ is set to 2300 Hz, and according to the principle above $F_{MAX}=F_{DEV}/2=1150$ Hz. The crossover frequency $F_{CR}$ then has to be lower than the frequency $F_{MAX}$, and in this particular case $F_{CR}$ is set to 1000 Hz. As the crossover filter attenuation is set to 24 dB/octave: $F_{C\text{-}C}=\frac{3}{4}F_{MAX}=863$ Hz, which corresponds to a wavelength of 0.39 m, i.e. the speaker units in the line-source has to be placed at a center to center distance of 0.195 m. The enclosure 11 is of closed type, which is designed in such a way that there are no parallel inner surfaces.

Figure 5A:
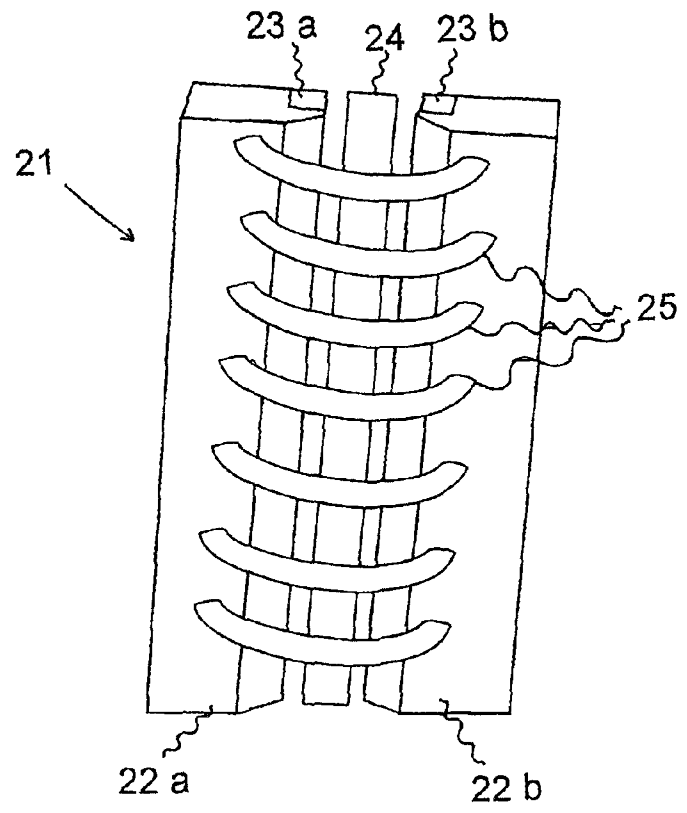
FIG. 5*a* shows a preferred ribbon speaker unit in perspective view.
Figure 5B:
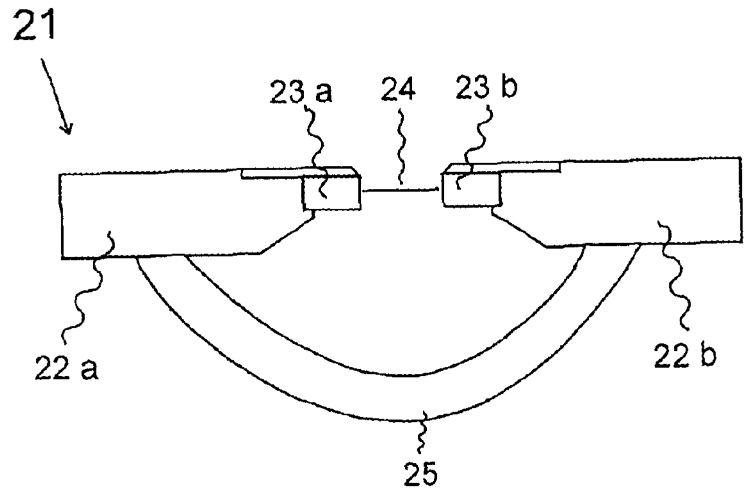
FIG. 5*b* is a top-view of the preferred ribbon speaker unit

The ribbon speaker unit mentioned above, is described in PCT/SE99/00654, which is incorporated herein in its entirety by reference, and is shown in FIGS. 5*a* and 5*b*. This ribbon speaker unit 21 comprises two or more elongated pole pieces 22*a*, 22*b* arranged in parallel to each other and distant from each other, comprising magnet elements 23*a*, 23*b* wherein two adjacent pole pieces 22*a*, 22*b* form an elongated slit in which an elongated membrane 24 of an electrically conducting material is moveably provided, said membrane 24 being electrically coupled such that it can conduct a drive current in the longitudinal direction of the membrane 24, and which is characterized in that a magnetic conductor 25 of a ferro-magnetic material is provided between the outermost located pole pieces 22*a*, 22*b*, said magnetic conductor 25 closing the magnetic circuit but leaving the slit or slits open in which the membranes 24 are provided, whereby the magnetic field strength is increased in the slit or slits.

Figure 6:
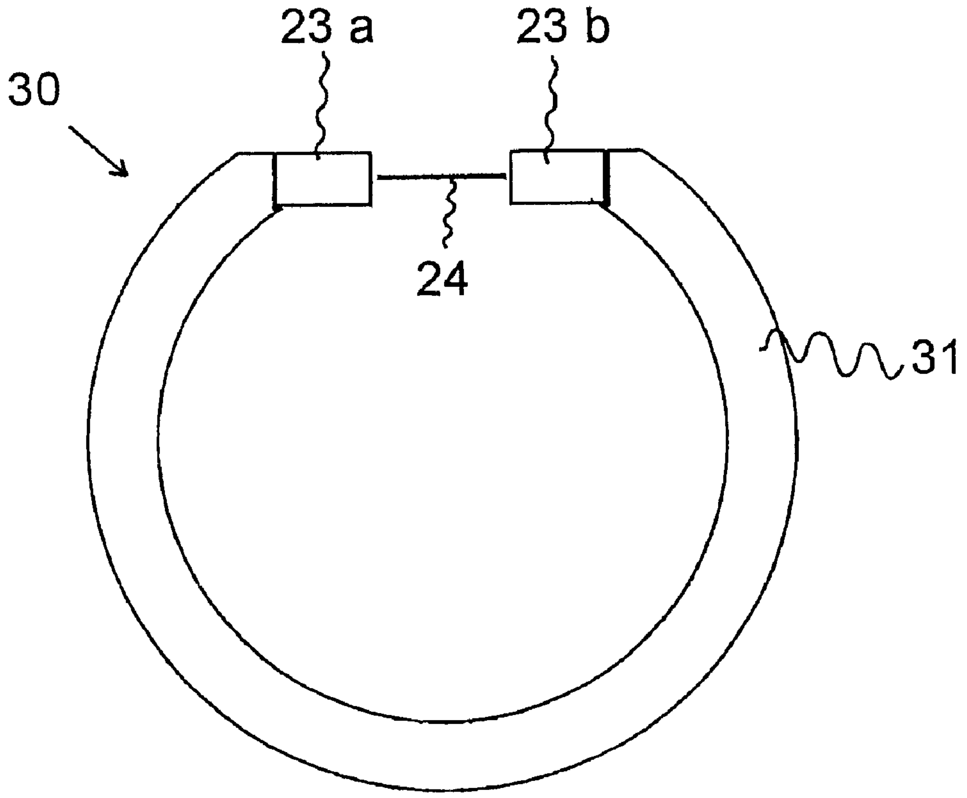
FIG. 6 is a top-view of an improved version of the preferred ribbon speaker unit.

Preferably, the ribbon speaker unit is characterized in that the pole pieces 22*a*, 22*b* and the magnetic conductor 25 are combined in one conducting/supporting piece 31 as shown in FIG. 6.

More in detail the conducting/supporting piece 31 can be made of a thick tube, made of ferro-magnetic material, in which a slit is made along the whole of its length, as is shown in FIG. 6, in which slit the magnet elements 23*a*, 23*b* and the membrane 24 are provided. This provides a ribbon speaker unit 30 with few parts, which thus is easier and cheaper to build. At the same time a closed enclosure is created, which protects the ribbon from rapid atmospheric pressure-changes.

Figure 9:
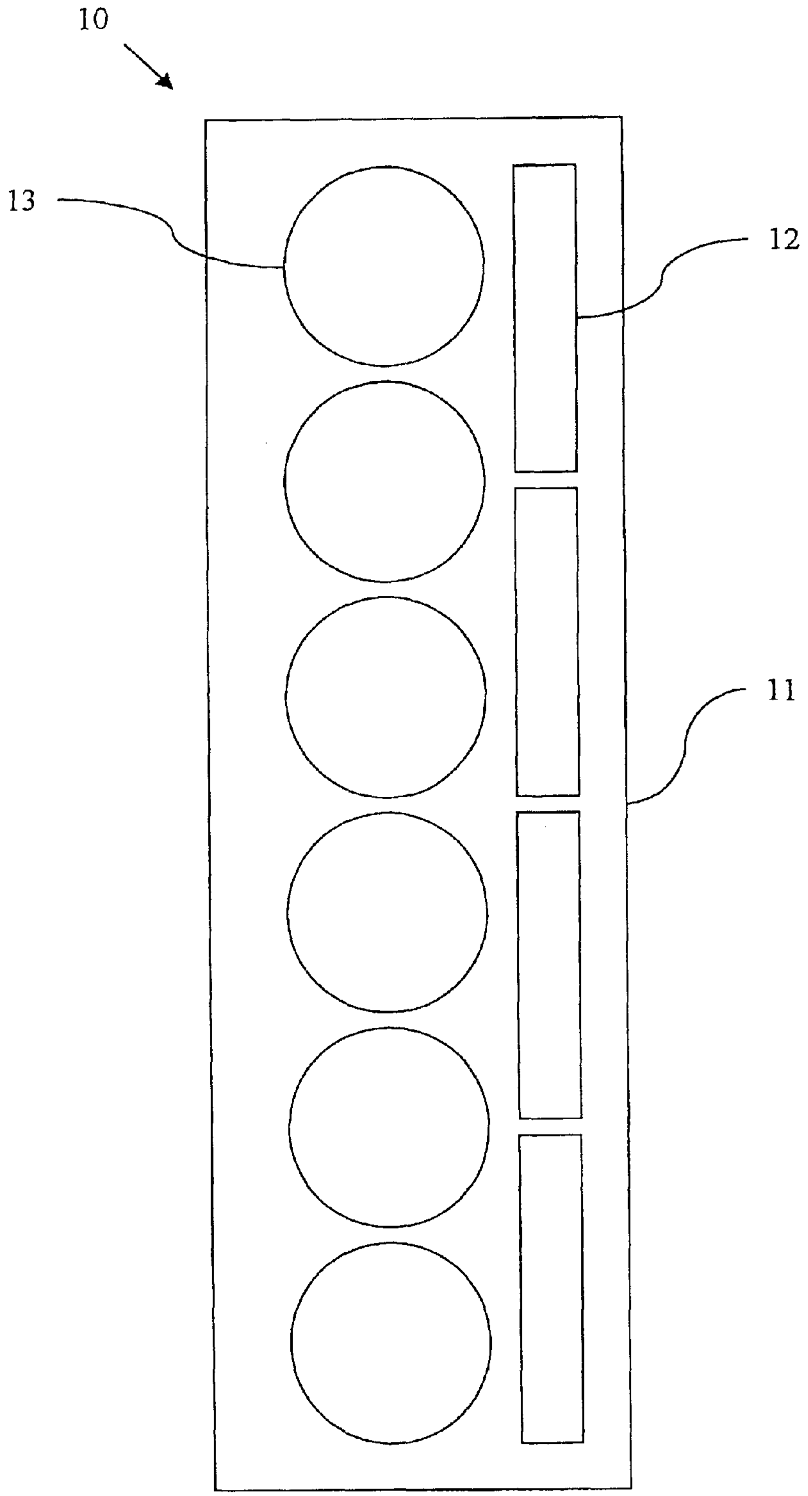
FIG. 9 shows another embodiment of an elongated high frequency transducer.

The elongated high frequency transducer can, alternatively, comprise one or more speaker units or other types, such as electrostatic, electrodynamic or piezoelectric drivers with or without horn, and the like. If the elongated high frequency transducer is made up of a plurality of point like speaker units it is important that the conditions above, concerning the distance between adjacent speaker units, are met. If the elongated high frequency transducer is made up of two or more speaker units with elongated radiating surfaces, the distance between two adjacent speaker units can be somewhat greater. However, to achieve an elongated high frequency transducer having an essentially continuous radiating surface along the axis of elongation, as illustrated in FIG. 9, the total length of the non-radiating parts between the speaker units must not exceed 20% (or preferably 10%) of the total length of the essentially continuous radiating surface of said high frequency transducer, and none of the non-radiating parts between two adjacent speaker units may exceed 10% (or preferably 5%) of the total length of the essentially continuous radiating surface of said high frequency transducer. If these conditions are not fulfilled, the sound emitted from the high frequency transducer will show problems with sound pressure loss, especially in the range close to the loudspeaker.

The loudspeaker system may, further, comprise two or more parallel elongated-high-frequency transducers if desired.

In an alternative embodiment of the invention comprising a ribbon speaker, the crossover filter can be omitted, due to the fact that a ribbon speaker normally comprise a transformer, as the conducting ribbon usually represent a much too low impedance for most amplifiers. This transformer could be so designed that it causes attenuation below a certain frequency, and if the low frequency speaker units in the line-source are designed to roll-off at the corresponding frequency, a loudspeaker system without crossover circuits can be constructed.

A system according to the invention can also be used as high and mid frequency loudspeakers in a three-way system, further comprising one or more sub-frequency loudspeakers. A suitable sub-frequency loudspeaker is disclosed in PCT/SE99/00655, which is incorporated herein in its entirety by reference, but other types of sub-frequency loudspeakers can also be used, as example closed box, vented box or horn.

The system according to the invention could, in addition to the elongated high frequency transducer, further comprise n parallel line-sources, wherein the speaker units of the first line-source have a diameter $SD_1$, the speaker units of the n:th line-source have a diameter $SD_n$, where $SD_1 \geqq SD_2 \geqq \ldots \geqq SD_n$, and where the highest frequency for each of the line sources is determined in the same manner as for the system comprising a single line-source. In such a way an (n+1)-way line-source system can be constructed.

Figure 7A:
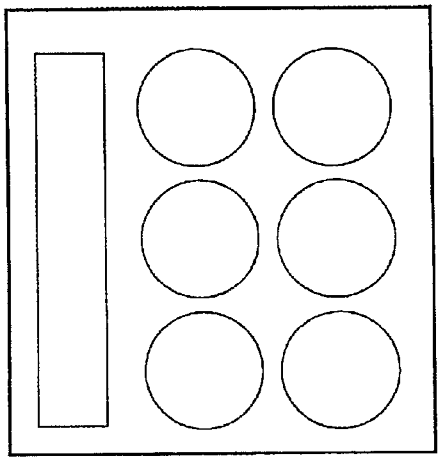
FIG. 7*a* to 7*c* shows alternative embodiments of the invention.
Figure 7B:
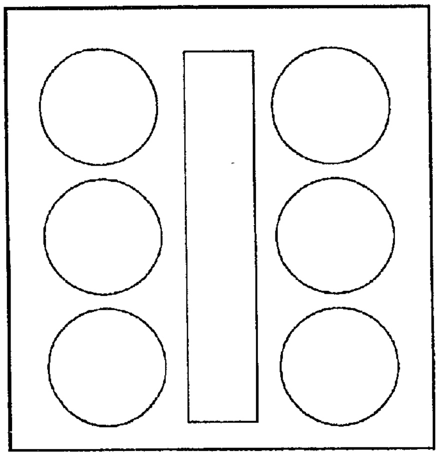
Figure 7C:
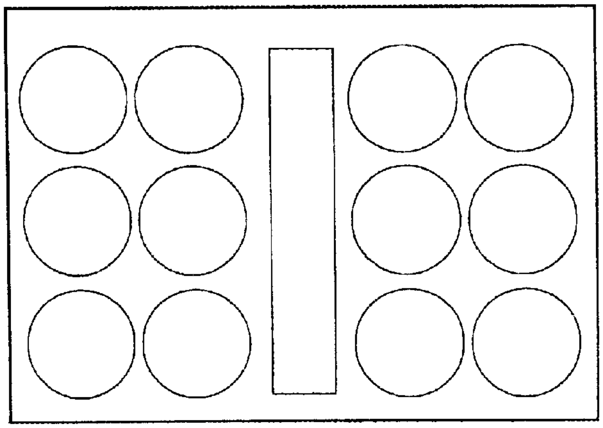

In an alternative embodiment, the system is equipped with two or more parallel line-sources (FIG. 7*a* to 7*c*), all comprising essentially identical speaker units. Two special versions of this embodiment are shown in FIGS. 7*b* and 7*c*, which comprise equal numbers of line-sources on each side of the high frequency transducer, this arrangement can be referred to as a "homogeneous line-source speaker".

In a further alternative embodiment of the system shown in FIG. 7*c*, the outermost line-sources on each side of the high frequency transducer only contributes in the sub-frequency region, i.e., below 180 Hz or lower.

Figure 8:
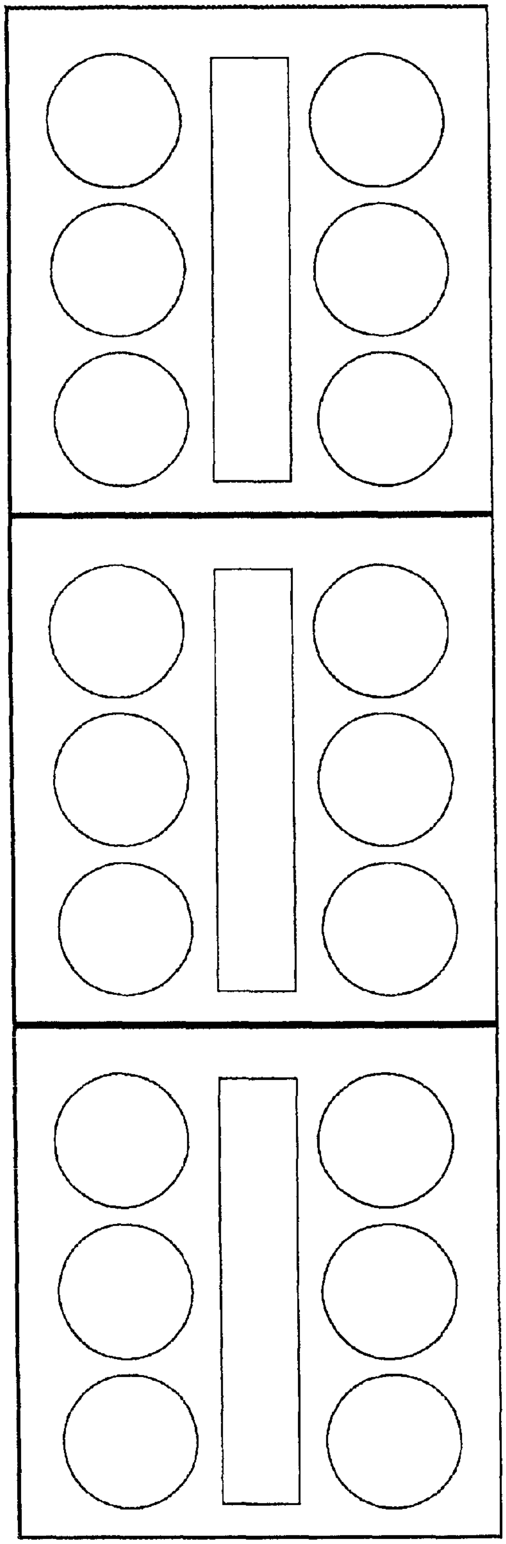
FIG. 8 shows an example of a modular embodiment of the invention.

To achieve the desired characteristics over large distances, a large number of speaker units are needed. To make such a system easier to handle, it can be divided into sub-sections, all arranged to be attached close to each other, so that a large system can be built from several sub-sections. Each sub-section does not have to be a line-source by it self. A system of this type is shown in FIG. 8, in which each line-source in the sub-section has a height of three speaker units, and the total system height is nine speaker units.

All systems described above include one or more line-sources comprising three or more essentially identical speaker units, where the speaker units are assumed to be conventional circular electro-dynamic cone speaker units. However, the line-source could be made up of speaker units of any type e.g. electrostatic, magnetostatic, electro-dynamic e.t.c., or shape, e.g., square, rectangular, oval e.t.c. In a special embodiment, where essentially rectangular or oval speaker units are used, the line-source may comprise two speaker units or even one speaker unit as long as it is made tall enough.

While the present invention has been described with reference to specific embodiments, it should be understood that modifications and variations of the invention may be constructed without departing from the scope of the invention defined in the following claims.

What is claimed is:

1. A loudspeaker system for creating a homogenous sound over large distances with a wide horizontal distribution comprising:

at least one line-source of acoustical radiation, each of said at least one line-source comprising three or more essentially identical speaker-units arranged adjacent to each other at a center-to-center spacing $D_1$, and at least one elongated high frequency transducer arranged in parallel with said at least one line source, said at least one elongated high frequency transducer having an essentially continuous radiating surface along an axis of elongation;

an input electrical audio signal divided into two parts at a crossover frequency $F_{CR}$ with an attenuation of at least 18 dB/octave;

wherein a first part of said two parts comprise frequencies lower than said crossover frequency $F_{CR}$;

wherein a second part of said two parts comprise frequencies higher than said crossover frequency $F_{CR}$;

wherein the first part is fed to said at least one line-source of acoustical radiation and the second part is fed to said at least one elongated high frequency transducers(s);

wherein a highest possible crossover frequency $F_{MAX}$ ($F_{CR} \leqq F_{MAX}$) for said speaker units in said at least one line-source of acoustical radiation is determined as a frequency which is at least one octave lower than a frequency $F_{DEV}$;

wherein said frequency $F_{DEV}$ is a frequency at which at least one of neither of a speaker response on-axis nor a speaker unit response 60° off-axis deviate more than ±3 dB from the speaker response 30° off-axis and the speaker responses on-axis do not deviate more than ±3 dB from a nominal sensitivity level $L_{nom}$;

wherein said nominal sensitivity level $L_{nom}$ is defined as the average sensitivity level between 300 Hz and 1000 Hz;

wherein said center-to-center spacing $D_1$ between the essentially identical speaker-units in said at least one line-source of acoustical radiation is less than one half of a wavelength corresponding to a frequency $F_{C-C}$; and wherein said frequency $F_{C-C}$, is, at a crossover attenuation of at least 24 dB/octave, one quarter of an octave lower than $F_{MAX}$, and, at a crossover attenuation that is less than 24 dB/octave, $F_{C-C}$ is equal to $F_{MAX}$.

2. The loudspeaker system of claim 1 comprising:

a plurality of parallel line-sources.

3. The loudspeaker system of claim 1 wherein:

at least one of said two parts of the input electrical audio signal is further divided into two or more sub-parts, each part of said two or more sub-parts is supplied to at least one linesource or said at least one elongated high frequency transducer.

4. The loudspeaker system of claim 1 wherein:

said at least one elongated high frequency transducer comprises two or more speaker units arranged adjacent to each other to form an elongated source of acoustical radiation in such a way that said at least one elongated high frequency transducer has non radiating parts between radiating parts;

wherein a total length of said non-radiating parts between the radiating parts of the two or more speaker units do not exceed 20% of a total length of an essentially continuous radiating surface of said at least one high frequency transducer; and none of said non-radiating parts between the radiating parts of said two adjacent speaker units exceed 10% of the total length of the essentially continuous radiating surface of said at least one elongated high frequency transducer.

5. The loudspeaker system of claim 1 wherein:

said at least one elongated high frequency transducer comprises two or more speaker units arranged adjacent to each other to form an elongated source of acoustical radiation in such a way that said at least one elongated high frequency transducer has non radiating parts between radiating parts;

wherein a total length of said non-radiating parts between the radiating parts of the two or more speaker units do not exceed 10% of a total length of an essentially continuous radiating surface of said high frequency transducer; and wherein none of said non-radiating parts between the radiating parts of said two adjacent speaker units exceed 5% of the total length of the essentially continuous radiating surface of said at least one elongated high frequency transducer.

6. The loudspeaker system of claim 1 wherein:

said at least one elongated high frequency transducer comprises one or more speaker units of ribbon type.

7. The loudspeaker system of claim 1 wherein:

said at least one elongated high frequency transducer comprises one or more speaker units of horn type.

8. The loudspeaker system of claim 6 wherein said speaker units of ribbon type further comprises:

two or more elongated magnet elements arranged in parallel to each other and distant from each other;

wherein two adjacent magnet elements form an elongated slit in which an elongated membrane of an electrically conducting material is moveably provided;

said membrane being electrically coupled such that it can conduct a drive current in a longitudinal direction of the membrane;

wherein a conducting/supporting piece made of ferromagnetic material is provided between an outermost located magnet elements; and said conducting/supporting piece closing the magnetic circuit but leaving the slit open in which the membrane is provided.

9. The loudspeaker system of claim 1 wherein:

said at least one elongated high frequency transducer and said at least one line-source of acoustical radiation are essentially of a same length in a longitudinal direction.

10. The loudspeaker system of claim 1 wherein:

said at least one elongated high frequency transducer and said at least one line-source of acoustical radiation are mounted in an enclosure.

11. The loudspeaker system of claim 1 wherein:

the speaker-units in the at least one line-source are electrically connected in parallel.

12. The loudspeaker system of claim 1 wherein:

the speaker-units in the at least one line-source are electro-dynamic speaker units.

13. The loudspeaker system of claim 1 wherein:

the at least one line-source of acoustical radiation is mounted in a closed enclosure.

14. The loudspeaker system of claim 1 wherein:

the at least one line-source of acoustical radiation is mounted in a vented enclosure.

15. The loudspeaker system of claim 1 wherein:

the at least one line-source of acoustical radiation is mounted in a baffle to create an acoustic dipole.

16. The loudspeaker system of claim 1 further comprising:

a substantially flat baffle.

17. The loudspeaker system of claim 1 further comprising:

a baffle providing different mounting levels for sources of different frequency ranges such that an acoustic center of different sources are arranged in a same plane.

18. The loudspeaker system of claim 1 further comprising:

two or more sub-sections;

wherein each of said two or more sub-sections supporting one or more speaker units;

said two or more sub-sections arranged to be attached close to each other in such a manner that they together form said at least one line source of acoustical radiation and said at least one elongated high frequency transducer.

19. The loudspeaker system of claim 1 wherein:

a second part of the input electrical audio signal is further divided into two or more sub-parts;

and wherein at least one sub-part of said two or more sub-parts is supplied to a sub-frequency loudspeaker.

20. The loudspeaker system of claim 1 further comprising:

two or more parallel line-sources of acoustical radiation; and wherein all of said speaker units are essentially identical.

21. The loudspeaker system of claim 20 wherein:

at least one of said two or more parallel line-sources of acoustical radiation are provided on each side of the at least one elongated high frequency transducer.

22. The loudspeaker system of claim 21 wherein:

an equal number of the parallel line-sources of acoustical radiation are provided on each side of the at least one elongated high frequency transducer.

23. The loudspeaker system of claim 21 wherein:

at least one of said two or more parallel line-sources of acoustical radiation are supplied an electrical signal only comprising frequencies in the sub-frequency region, below 180 Hz.

24. The loudspeaker system of claim 1 wherein:

the center-to-center spacing between said at least one line-source of acoustical radiation and said at least one elongated high frequency transducer arranged in parallel with said at least one line-source, is less than one half of the wavelength corresponding to a frequency $F_{C\text{-}C}$; and said frequency $F_{C\text{-}C}$, is, at a crossover attenuation of at least 24 dB/octave, one quarter of an octave lower than $F_{MAX}$, and, at a crossover attenuation that is less than 24 dB/octave, $F_{C\text{-}C}$ is equal to $F_{MAX}$.

25. A method for designing a loudspeaker system for creating a homogenous sound over large distances, comprising the following steps:

providing at least one line-source of acoustical radiation, each said at least one line-source comprising three or more essentially identical speaker-units arranged adjacent to each other at a center-to-center spacing $D_1$, and at least one elongated high frequency transducer arranged in parallel with said at least one line source, said at least one elongated high frequency transducer having an essentially continuous radiating surface along the axis of elongation;

providing an input electrical audio signal divided into two parts at a crossover frequency $F_{CR}$ with an attenuation of at least 18 dB/octave;

wherein a first part of said two parts comprises frequencies lower than said crossover frequency $F_{CR}$;

wherein a second part of said two parts comprises frequencies higher than said crossover frequency $F_{CR}$, whereby the first part is fed to said at least one line-source of acoustical radiation and the second part is fed to said at least one elongated high frequency transducer;

defining a highest possible crossover frequency $F_{MAX}$ ($F_{CR} \leqq F_{MAX}$) for the speaker units in said at least one line-source of acoustical radiation, as a frequency, which is at least one octave lower than a frequency $F_{DEV}$;

defining said frequency $F_{DEV}$ as a frequency at which neither of a speaker response on-axis nor a speaker response 60° off-axis deviate more than ±3 dB from the speaker response 30° off-axis, and/or at which the speaker response on-axis do not deviate more than ±3 dB from the nominal sensitivity level $L_{nom}$ defined as the average sensitivity level between 300 Hz and 1000 Hz;

defining said center-to-center spacing $D_1$ between the essentially identical speaker-units in the at least one line-source of acoustical radiation, to be less than one half of a wavelength corresponding to a frequency $F_{C\text{-}C}$; and defining said frequency $F_{C\text{-}C}$, to be one quarter of an octave lower than $F_{MAX}$, at a crossover attenuation of at least 24 dB/octave, and to be equal to $F_{MAX}$, at a crossover attenuation that is less than 24 dB/octave.

* * * * *